US007774393B1

(12) United States Patent
Brooks et al.

(10) Patent No.: US 7,774,393 B1
(45) Date of Patent: Aug. 10, 2010

(54) APPARATUS AND METHOD FOR INTEGER TO FLOATING-POINT FORMAT CONVERSION

(75) Inventors: Jeffrey S. Brooks, Austin, TX (US); Sadar U. Ahmed, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 1237 days.

(21) Appl. No.: 10/881,187

(22) Filed: Jun. 30, 2004

(51) Int. Cl.
*G06F 7/00* (2006.01)

(52) U.S. Cl. .................. 708/204; 708/205; 708/206; 708/209; 708/507; 708/508

(58) Field of Classification Search ......... 708/204–211, 708/507, 508
See application file for complete search history.

(56) References Cited

U.S. PATENT DOCUMENTS

| | | | | |
|---|---|---|---|---|
| 4,488,252 A | * | 12/1984 | Vassar | 708/505 |
| 5,020,013 A | * | 5/1991 | Maher et al. | 708/209 |
| 5,046,068 A | | 9/1991 | Kubo et al. | |
| 5,200,916 A | * | 4/1993 | Yoshida | 708/505 |
| 5,257,215 A | | 10/1993 | Poon | |
| 5,303,174 A | * | 4/1994 | Okamoto | 708/505 |
| 5,339,266 A | | 8/1994 | Hinds et al. | |
| 5,386,375 A | | 1/1995 | Smith | |
| 5,515,308 A | | 5/1996 | Karp et al. | |
| 5,546,593 A | | 8/1996 | Kimura et al. | |
| 5,612,909 A | * | 3/1997 | Morrow | 708/550 |
| 5,619,439 A | | 4/1997 | Yu et al. | |
| 5,954,789 A | | 9/1999 | Yu et al. | |
| 6,076,157 A | | 6/2000 | Borkenhagen et al. | |
| 6,088,788 A | | 7/2000 | Borkenhagen et al. | |
| 6,088,800 A | | 7/2000 | Jones et al. | |
| 6,105,127 A | | 8/2000 | Kimura et al. | |
| 6,131,104 A | | 10/2000 | Oberman | |
| 6,175,847 B1 | * | 1/2001 | Brooks et al. | 708/205 |

(Continued)

OTHER PUBLICATIONS

Tulsen et al., "Power-sensitive multithreaded architecture," IEEE 2000, pp. 199-206.

(Continued)

*Primary Examiner*—Lewis A Bullock, Jr.
*Assistant Examiner*—Michael Yaary
(74) *Attorney, Agent, or Firm*—Robert C Kowert; Meyertons, Hood, Kivlin, Kowert & Goetzel, P.C.

(57) ABSTRACT

An apparatus and method for integer to floating-point format conversion. A processor may include an adder configured to perform addition of respective mantissas of two floating-point operands to produce a sum, where a smaller-exponent one of the floating-point operands has a respective exponent less than or equal to a respective exponent of a larger-exponent one of the floating-point operands. The processor may further include an alignment shifter coupled to the adder and configured, in a first mode of operation, to align the floating-point operands prior to the addition by shifting the respective mantissa of the smaller-exponent operand towards a least-significant bit position. The alignment shifter may be further configured, in a second mode of operation, to normalize an integer operand by shifting the integer operand towards a most-significant bit position. The second mode of operation may be active during execution of an instruction to convert the integer operand to floating-point format.

21 Claims, 8 Drawing Sheets

U.S. PATENT DOCUMENTS

| | | | |
|---|---|---|---|
| 6,212,544 | B1 | 4/2001 | Borkenhagen et al. |
| 6,212,627 | B1 * | 4/2001 | Dulong et al. ............... 712/222 |
| 6,269,384 | B1 * | 7/2001 | Oberman .................... 708/497 |
| 6,282,554 | B1 | 8/2001 | Abdallah et al. |
| 6,341,347 | B1 | 1/2002 | Joy et al. |
| 6,349,319 | B1 | 2/2002 | Shankar et al. |
| 6,357,016 | B1 | 3/2002 | Rodgers et al. |
| 6,397,238 | B2 * | 5/2002 | Oberman et al. ............ 708/497 |
| 6,397,239 | B2 | 5/2002 | Oberman et al. |
| 6,415,308 | B1 | 7/2002 | Dhablania et al. |
| 6,427,196 | B1 | 7/2002 | Adiletta et al. |
| 6,434,699 | B1 | 8/2002 | Jones et al. |
| 6,496,925 | B1 | 12/2002 | Rodgers et al. |
| 6,507,862 | B1 | 1/2003 | Joy et al. |
| 6,523,050 | B1 | 2/2003 | Dhablania et al. |
| 6,564,328 | B1 | 5/2003 | Grochowski et al. |
| 6,567,839 | B1 | 5/2003 | Borkenhagen et al. |
| 6,594,681 | B1 | 7/2003 | Prabhu |
| 6,625,654 | B1 | 9/2003 | Wolrich et al. |
| 6,629,236 | B1 | 9/2003 | Aipperspach et al. |
| 6,629,237 | B2 | 9/2003 | Wolrich et al. |
| 6,668,308 | B2 | 12/2003 | Barroso et al. |
| 6,668,317 | B1 | 12/2003 | Bernstein et al. |
| 6,671,827 | B2 | 12/2003 | Guilford et al. |
| 6,681,345 | B1 | 1/2004 | Storino et al. |
| 6,687,838 | B2 | 2/2004 | Orenstien et al. |
| 6,694,347 | B2 | 2/2004 | Joy et al. |
| 6,694,425 | B1 | 2/2004 | Eickemeyer |
| 6,697,935 | B1 | 2/2004 | Borkenhagen et al. |
| 6,728,845 | B2 | 4/2004 | Adiletta et al. |
| 6,748,556 | B1 | 6/2004 | Storino et al. |
| 6,801,997 | B2 | 10/2004 | Joy et al. |
| 6,820,107 | B1 | 11/2004 | Kawai et al. |
| 6,847,985 | B1 | 1/2005 | Gupta et al. |
| 6,857,064 | B2 | 2/2005 | Smith et al. |
| 6,883,107 | B2 | 4/2005 | Rodgers et al. |
| 6,889,319 | B1 | 5/2005 | Rodgers et al. |
| 6,898,694 | B2 | 5/2005 | Kottapalli et al. |

OTHER PUBLICATIONS

Uhrig et al., "Hardware-based power management for real-time applications," Proceedings of the Second International Symposium on Parallel and Distributed Computing, IEEE 2003, 8 pages.

Tullsen, et al., "Simultaneous Multithreading: Maximizing On-Chip Parallelism," ISCA 1995, pp. 533-544.

Tullsen, et al., "Exploiting Choice: Instruction Fetch and Issue on an Implementable Simultaneous Multithreading Processor," pp. 191-202.

Smith, "The End of Architecture," May 29, 1990, pp. 10-17.

Alverson et al., "Tera Hardware-Software Cooperation," 16 pages.

Ungerer et al., "A Survey of Processors with Explicit Multithreading," ACM Computing Surveys, vol. 35, No. 1, Mar. 2003, pp. 29-63.

Alverson et al., "The Tera Computer System," ACM 1990, 6 pages.

Alverson et al., "Exploiting Heterogeneous Parallelism on a Multithreaded Multiprocessor," ACM 1992, pp. 188-197.

Uhrig, et al., "Implementing Real-Time Scheduling Within a Multithreaded Java Microcontroller," 8 pages.

Ide, et al., "A 320-MFLOPS CMOS Floating-Point Processing Unit for Superscalar Processors," IEEE 1993, 5 pages.

Nemawarkar, et al., "Latency Tolerance: A Metric for Performance Analysis of Multithreaded Architectures," IEEE 1997, pp. 227-232.

Baniasadi, et al., "Instruction Flow-Based Front-end Throttling for Power-Aware High-Performance Processors," ACM 2001, pp. 16-21.

Gura, et al., "An End-to-End Systems Approach to Elliptic Curve Cryptography," 16 pages.

Eberle, et al., "Cryptographic Processor for Arbitrary Elliptic Curves over $GF(2^m)$," 11 pages.

* cited by examiner

| | 0 | 1 | 2 | 3 | 4 | 5 | 6 | 7 |
|---|---|---|---|---|---|---|---|---|
| Fetch (F) | T0 | T3 | T6 | T2 | T7 | T5 | T1 | T4 |
| Cache (C) | | T0 | T3 | T6 | T2 | T7 | T5 | T1 |
| Pick (P) | | | T0 | T3 | T6 | T2 | T7 | T5 |
| Decode (D) | | | | T0 | T3 | T6 | T2 | T7 |
| Execute (E) | | | | | T0 | T3 | T6 | T2 |
| Memory (M) | | | | | | T0 | T3 | T6 |
| Bypass (B) | | | | | | | T0 | T3 |
| Writeback (W) | | | | | | | | T0 |
| Execution cycle | | | | | | | | |

*FIG. 3*

APPARATUS AND METHOD FOR INTEGER TO FLOATING-POINT FORMAT CONVERSION

BACKGROUND OF THE INVENTION

1. Field of the Invention

This invention relates to processors and, more particularly, to execution of floating-point arithmetic instructions.

2. Description of the Related Art

In many processor implementations that include support for floating-point arithmetic, support for conversion of data from an integer format to a floating-point format is also provided. For example, an instruction set architecture may define specific instructions to perform such conversion, in order to allow programmers to perform floating-point operations on data originally formatted as integer data.

In some embodiments, floating-point data is represented in a normalized format in which the floating-point mantissa and exponent are adjusted so that the most significant bit of the floating-point mantissa is equal to one. If the result of a floating-point operation, such as addition or subtraction, is not normalized, a normalization shift may be performed to normalize the result. Additionally, in some embodiments certain floating-point results may not be capable of an exact representation using a finite number of digits. In some such embodiments, such inexact results may be rounded according to a particular rounding mode.

When floating-point operands are normalized, it may be the case that a given floating-point addition or subtraction operation requires either a large normalization shift of the result or result rounding, but not both. In some embodiments, a floating-point addition pipeline may be optimized for the exclusivity of these cases, for example by allowing normalization and rounding to occur in parallel rather than serially.

However, integer data that is to be converted to floating-point format is not necessarily normalized, and may not exactly convert to floating-point representation (thus requiring rounding). Integer-to-floating-point conversion may therefore violate the exclusivity assumption just mentioned. In some embodiments, if integer-to-floating-point conversion is implemented within a floating-point addition pipeline that is optimized based on the exclusivity of normalization and rounding, integer-to-floating-point conversion instructions may require an extra execution cycle relative to other floating-point instructions in order to perform rounding. This may degrade performance of the conversion instructions and may create a pipeline hazard in pipelined floating-point embodiments, which may degrade the performance of other floating-point instructions. In an alternative embodiment, additional dedicated logic may be implemented specifically to handle normalization of integer operands, but such additional logic may incur additional design area and power consumption.

SUMMARY

Various embodiments of an apparatus and method for integer to floating-point format conversion are disclosed. In one embodiment, a processor may include an adder configured to perform addition of respective mantissas of two floating-point operands to produce a sum, where a smaller-exponent one of the floating-point operands has a respective exponent less than or equal to a respective exponent of a larger-exponent one of the floating-point operands. The processor may further include an alignment shifter coupled to the adder and configured, in a first mode of operation, to align the floating-point operands prior to the addition by shifting the respective mantissa of the smaller-exponent operand towards a least-significant bit position. The alignment shifter may be further configured, in a second mode of operation, to normalize an integer operand by shifting the integer operand towards a most-significant bit position. The second mode of operation may be active during execution of an instruction to convert the integer operand to floating-point format.

In one embodiment, a method may include determining whether an instruction to convert an integer operand to floating-point format is executing, and if the instruction is not executing, configuring an alignment shifter to align two floating-point operands having respective mantissas by shifting the respective mantissa of a smaller-exponent one of the floating point operands towards a least-significant bit position. The method may further include, if the instruction is executing, configuring the alignment shifter to normalize an integer operand by shifting the integer operand towards a most-significant bit position. The smaller-exponent operand may have a respective exponent less than or equal to a respective exponent of a larger-exponent one of the floating-point operands.

BRIEF DESCRIPTION OF THE DRAWINGS

FIG. 3 is a pipeline diagram illustrating the flow of instructions through one embodiment of a processor core.

Figure 1:
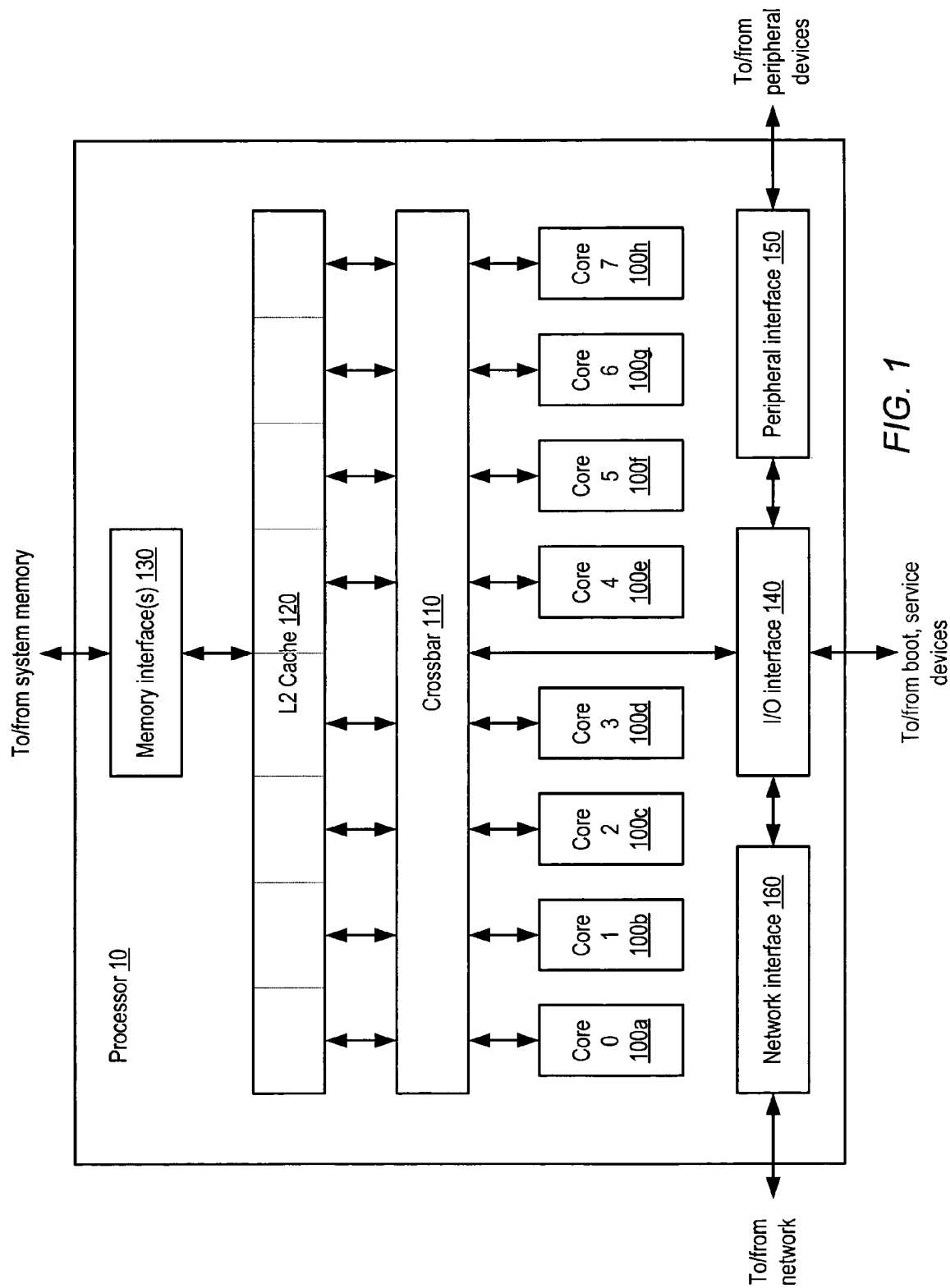
FIG. 1 is a block diagram illustrating one embodiment of a multithreaded processor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Overview of Multithreaded Processor Architecture

A block diagram illustrating one embodiment of a multithreaded processor 10 is shown in FIG. 1. In the illustrated embodiment, processor 10 includes a plurality of processor cores 100*a-h*, which are also designated "core 0" though "core 7". Each of cores 100 is coupled to an L2 cache 120 via a crossbar 110. L2 cache 120 is coupled to one or more memory interface(s) 130, which are coupled in turn to one or more banks of system memory (not shown). Additionally, crossbar 110 couples cores 100 to input/output (I/O) interface 140, which is in turn coupled to a peripheral interface 150 and a network interface 160. As described in greater detail below, I/O interface 140, peripheral interface 150 and network interface 160 may respectively couple processor 10 to boot and/or service devices, peripheral devices, and a network.

Cores 100 may be configured to execute instructions and to process data according to a particular instruction set architecture (ISA). In one embodiment, cores 100 may be configured to implement the SPARC® V9 ISA, although in other embodiments it is contemplated that any desired ISA may be employed, such as x86, PowerPC® or MIPS®, for example. In the illustrated embodiment, each of cores 100 may be configured to operate independently of the others, such that all cores 100 may execute in parallel. Additionally, as described below in conjunction with the descriptions of FIG. 2 and FIG. 3, in some embodiments each of cores 100 may be configured to execute multiple threads concurrently, where a given thread may include a set of instructions that may execute independently of instructions from another thread. (For example, an individual software process, such as an application, may consist of one or more threads that may be scheduled for execution by an operating system.) Such a core 100 may also be referred to as a multithreaded (MT) core. In one embodiment, each of cores 100 may be configured to concurrently execute instructions from eight threads, for a total of 64 threads concurrently executing across processor 10. However, in other embodiments it is contemplated that other numbers of cores 100 may be provided, and that cores 100 may concurrently process different numbers of threads.

Crossbar 110 may be configured to manage data flow between cores 100 and the shared L2 cache 120. In one embodiment, crossbar 110 may include logic (such as multiplexers or a switch fabric, for example) that allows any core 100 to access any bank of L2 cache 120, and that conversely allows data to be returned from any L2 bank to any core 100. Crossbar 110 may be configured to concurrently process data requests from cores 100 to L2 cache 120 as well as data responses from L2 cache 120 to cores 100. In some embodiments, crossbar 110 may include logic to queue data requests and/or responses, such that requests and responses may not block other activity while waiting for service. Additionally, in one embodiment crossbar 110 may be configured to arbitrate conflicts that may occur when multiple cores 100 attempt to access a single bank of L2 cache 120 or vice versa.

L2 cache 120 may be configured to cache instructions and data for use by cores 100. In the illustrated embodiment, L2 cache 120 may be organized into eight separately addressable banks that may each be independently accessed, such that in the absence of conflicts, each bank may concurrently return data to a respective core 100. In some embodiments, each individual bank may be implemented using set-associative or direct-mapped techniques. For example, in one embodiment, L2 cache 120 may be a 4 megabyte (MB) cache, where each 512 kilobyte (KB) bank is 16-way set associative with a 64-byte line size, although other cache sizes and geometries are possible and contemplated. L2 cache 120 may be implemented in some embodiments as a writeback cache in which written (dirty) data may not be written to system memory until a corresponding cache line is evicted.

In some embodiments, L2 cache 120 may implement queues for requests arriving from and results to be sent to crossbar 110. Additionally, in some embodiments L2 cache 120 may implement a fill buffer configured to store fill data arriving from memory interface 130, a writeback buffer configured to store dirty evicted data to be written to memory, and/or a miss buffer configured to store L2 cache accesses that cannot be processed as simple cache hits (e.g., L2 cache misses, cache accesses matching older misses, accesses such as atomic operations that may require multiple cache accesses, etc.). L2 cache 120 may variously be implemented as single-ported or multiported (i.e., capable of processing multiple concurrent read and/or write accesses). In either case, L2 cache 120 may implement arbitration logic to prioritize cache access among various cache read and write requestors.

Memory interface 130 may be configured to manage the transfer of data between L2 cache 120 and system memory, for example in response to L2 fill requests and data evictions. In some embodiments, multiple instances of memory interface 130 may be implemented, with each instance configured to control a respective bank of system memory. Memory interface 130 may be configured to interface to any suitable type of system memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. In some embodiments, memory interface 130 may be configured to support interfacing to multiple different types of system memory.

In the illustrated embodiment, processor 10 may also be configured to receive data from sources other than system memory. I/O interface 140 may be configured to provide a central interface for such sources to exchange data with cores 100 and/or L2 cache 120 via crossbar 110. In some embodiments, I/O interface 140 may be configured to coordinate Direct Memory Access (DMA) transfers of data between network interface 160 or peripheral interface 150 and system memory via memory interface 130. In addition to coordinating access between crossbar 110 and other interface logic, in one embodiment I/O interface 140 may be configured to couple processor 10 to external boot and/or service devices. For example, initialization and startup of processor 10 may be controlled by an external device (such as, e.g., a Field Programmable Gate Array (FPGA)) that may be configured to provide an implementation- or system-specific sequence of boot instructions and data. Such a boot sequence may, for example, coordinate reset testing, initialization of peripheral devices and initial execution of processor 10, before the boot process proceeds to load data from a disk or network device. Additionally, in some embodiments such an external device may be configured to place processor 10 in a debug, diagnostic, or other type of service mode upon request.

Peripheral interface 150 may be configured to coordinate data transfer between processor 10 and one or more peripheral devices. Such peripheral devices may include, without limitation, storage devices (e.g., magnetic or optical media-based storage devices including hard drives, tape drives, CD drives, DVD drives, etc.), display devices (e.g., graphics subsystems), multimedia devices (e.g., audio processing subsystems), or any other suitable type of peripheral device. In one embodiment, peripheral interface 150 may implement one or more instances of an interface such as Peripheral Component Interface Express (PCI Express™), although it is contemplated that any suitable interface standard or combination of standards may be employed. For example, in some embodiments peripheral interface 150 may be configured to implement a version of Universal Serial Bus (USB) protocol or IEEE 1394 (Firewire®) protocol in addition to or instead of PCI Express™.

Network interface 160 may be configured to coordinate data transfer between processor 10 and one or more devices (e.g., other computer systems) coupled to processor 10 via a network. In one embodiment, network interface 160 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, network interface 160 may be configured to implement multiple discrete network interface ports.

Overview of Fine-Grained Multithreading Processor Core

As mentioned above, in one embodiment each of cores 100 may be configured for multithreaded execution. More specifically, in one embodiment each of cores 100 may be configured to perform fine-grained multithreading, in which each core may select instructions to execute from among a pool of instructions corresponding to multiple threads, such that instructions from different threads may be scheduled to execute adjacently. For example, in a pipelined embodiment of core 100 employing fine-grained multithreading, instructions from different threads may occupy adjacent pipeline stages, such that instructions from several threads may be in various stages of execution during a given core processing cycle.

Figure 2:
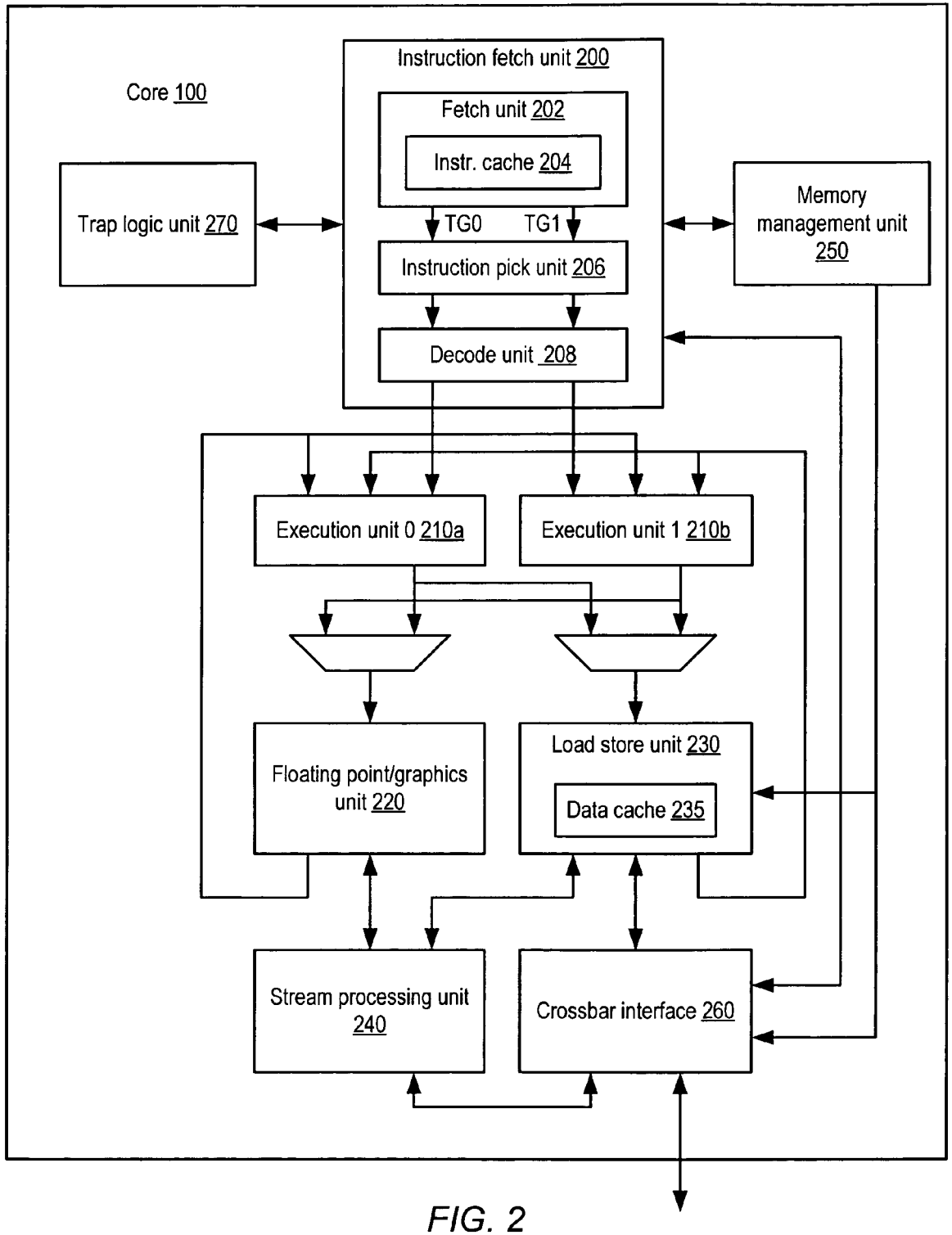
FIG. 2 is a block diagram illustrating one embodiment of a processor core configured to perform fine-grained multithreading.

One embodiment of core 100 configured to perform fine-grained multithreading is illustrated in FIG. 2. In the illustrated embodiment, core 100 includes an instruction fetch unit (IFU) 200 coupled to a memory management unit (MMU) 250, a crossbar interface 260, a trap logic unit (TLU) 270, and a plurality of execution units (EXU0, EXU1) 210*a-b*. (Execution units 210*a-b* may also be referred to generically as EXUs 210.) Each of execution units 210*a-b* is coupled to both a floating point/graphics unit (FGU) 220 and a load store unit (LSU) 230. Each of the latter units is also coupled to send data back to each of execution units 210*a-b*. Both FGU 220 and LSU 230 are coupled to a stream processing unit (SPU) 240. Additionally, LSU 230, SPU 240 and MMU 250 are coupled to crossbar interface 260, which is in turn coupled to crossbar 110 shown in FIG. 1.

Instruction fetch unit 200 may be configured to provide instructions to the rest of core 100 for execution. In the illustrated embodiment, IFU 200 includes a fetch unit 202, an instruction pick unit 206, and a decode unit 208. Fetch unit 202 further includes an instruction cache 204. In one embodiment, fetch unit 202 may include logic to maintain fetch addresses (e.g., derived from program counters) corresponding to each thread being executed by core 100, and to coordinate the retrieval of instructions from instruction cache 204 according to those fetch addresses. In some embodiments, instruction cache 202 may include fewer access ports than the number of threads executable on core 100, in which case fetch unit 202 may implement arbitration logic configured to select one or more threads for instruction fetch during a given execution cycle. For example, fetch unit 202 may implement a least-recently-fetched algorithm to select a thread to fetch. Fetch unit 202 may also implement logic to handle instruction cache misses and translation of virtual instruction fetch addresses to physical addresses (e.g., fetch unit 202 may include an Instruction Translation Lookaside Buffer (ITLB)). Additionally, in some embodiments fetch unit 202 may include logic to predict branch outcomes and/or fetch target addresses, such as a Branch History Table (BHT), Branch Target Buffer (BTB), or other suitable structure, for example.

In one embodiment, fetch unit 202 may be configured to maintain a pool of fetched, ready-for-issue instructions drawn from among each of the threads being executed by core 100. For example, fetch unit 202 may implement a respective instruction buffer corresponding to each thread in which several recently-fetched instructions from the corresponding thread may be stored. In one embodiment, instruction pick unit 206 may be configured to select one or more instructions to be decoded and issued to execution units 210. In the illustrated embodiment, the threads fetched by fetch unit 202 may be divided into two thread groups denoted TG0 and TG1 (for example, if core 100 implements eight threads, each of TG0 and TG1 may include four threads).

Pick unit 206, in the illustrated embodiment, may be configured to attempt to select one instruction to schedule for execution from each of TG0 and TG1, such that two instructions may be selected for execution during a given execution cycle. For example, pick unit 206 may employ a least-recently-picked (LRP) algorithm in which the least recently picked thread within a given thread group that is ready for execution is selected. It is noted that in one embodiment, thread fetching as performed by fetch unit 202 and instruction selection as performed by pick unit 206 may be largely independent of one another. In some embodiments, pick unit 206 may schedule instructions before all factors affecting instruction scheduling are known (e.g., instruction dependencies, implementation-specific resource hazards, etc.), in which case a picked instruction may be canceled at a later execution stage. In other embodiments, it is contemplated that other instruction selection algorithms may be employed, including algorithms that take additional instruction scheduling factors into account. Further, it is contemplated that in some embodiments, pick unit 206 may be configured to select more than two instructions for execution in a given execution cycle, or may select instructions from all threads rather than specific groups of threads. Additionally, in one embodiment pick unit 206 may be configured to identify source operand dependencies that a given picked instruction may have on a previously issued instruction, and may configure other logic to appropriately select source operands (e.g., from a register file, or from a previous execution cycle via bypass logic).

Decode unit 208 may be configured to further prepare instructions selected by pick unit 206 for execution. In the illustrated embodiment, decode unit 208 may be configured to identify the specific type of a given instruction, such as whether the instruction is an integer, floating point, load/store, or other type of instruction, as well as to identify operands required by the given instruction. Additionally, in one embodiment decode unit 208 may be configured to detect and respond to scheduling hazards not detected during operation of pick unit 206. For example, in the illustrated embodiment, only one load store unit 230 is provided. Consequently, if two load/store-type instructions were picked for execution, decode unit 208 may be configured to cancel or stall one of those instructions and allow the other to be issued. In such an embodiment, decode unit 208 may employ an arbitration algorithm to determine which instruction to issue without favoring a particular thread or thread group. Numerous other types of scheduling and resource hazards detectable by decode unit 208 are possible and contemplated.

In some embodiments, instructions from a given thread may be speculatively issued from decode unit 208 for execution. For example, a given instruction from a certain thread may fall in the shadow of a conditional branch instruction from that same thread that was predicted to be taken or not-taken, or a load instruction from that same thread that was predicted to hit in data cache 235, but for which the actual outcome has not yet been determined. In such embodiments, after receiving notice of a misspeculation such as a branch misprediction or a load miss, IFU 200 may be configured to cancel misspeculated instructions from a given thread as well as issued instructions from the given thread that are dependent on or subsequent to the misspeculated instruction, and to redirect instruction fetch appropriately.

Execution units 210*a-b* may be configured to execute and provide results for certain types of instructions issued from IFU 200. In one embodiment, each of EXUs 210 may be similarly or identically configured to execute certain integer-type instructions defined in the implemented ISA, such as arithmetic, logical, and shift instructions. In the illustrated embodiment, EXU0 210a may be configured to execute integer instructions issued from TG0, while EXU1 210b may be configured to execute integer instructions issued from TG1. Further, each of EXUs 210 may include an integer register file configured to store register state information for all threads in its respective thread group. For example, if core 100 implements eight threads 0-7 where threads 0-3 are bound to TG0 and threads 4-7 are bound to TG1, EXU0 210a may store integer register state for each of threads 0-3 while EXU1 210b may store integer register state for each of threads 4-7. It is contemplated that in some embodiments, core 100 may include more or fewer than two EXUs 210, and EXUs 210 may or may not be symmetric in functionality. Also, in some embodiments EXUs 210 may not be bound to specific thread groups or may be differently bound than just described. Finally, in the illustrated embodiment instructions destined for FGU 220 or LSU 230 pass through one of EXUs 210. However, in alternative embodiments it is contemplated that such instructions may be issued directly from IFU 200 to their respective units without passing through one of EXUs 210.

Floating point/graphics unit 220 may be configured to execute and provide results for certain floating-point and graphics-oriented instructions defined in the implemented ISA. For example, in one embodiment FGU 220 may implement single- and double-precision floating-point arithmetic instructions compliant with a version of the Institute of Electrical and Electronics Engineers (IEEE) 754 Standard for Binary Floating-Point Arithmetic (more simply referred to as the IEEE 754 standard), such as add, subtract, multiply, divide, and certain transcendental functions. Also, in one embodiment FGU 220 may implement partitioned-arithmetic and graphics-oriented instructions defined by a version of the SPARC® Visual Instruction Set (VIS™) architecture, such as VIS™ 2.0. Additionally, in one embodiment FGU 220 may implement certain integer instructions such as integer multiply, divide, and population count instructions, and may be configured to perform multiplication operations on behalf of stream processing unit 240. Depending on the implementation of FGU 220, some instructions (e.g., some transcendental or extended-precision instructions) or instruction operand or result scenarios (e.g., certain denormal operands or expected results) may be trapped and handled or emulated by software.

In the illustrated embodiment, FGU 220 may be configured to store floating-point register state information for each thread in a floating-point register file. In one embodiment, FGU 220 may implement separate execution pipelines for floating point add/multiply, divide/square root, and graphics operations, while in other embodiments the instructions implemented by FGU 220 may be differently partitioned. In various embodiments, instructions implemented by FGU 220 may be fully pipelined (i.e., FGU 220 may be capable of starting one new instruction per execution cycle), partially pipelined, or may block issue until complete, depending on the instruction type. For example, in one embodiment floating-point add operations may be fully pipelined, while floating-point divide operations may block other divide/square root operations until completed.

Load store unit 230 may be configured to process data memory references, such as integer and floating-point load and store instructions as well as memory requests that may originate from stream processing unit 240. In some embodiments, LSU 230 may also be configured to assist in the processing of instruction cache 204 misses originating from IFU 200. LSU 230 may include a data cache 235 as well as logic configured to detect cache misses and to responsively request data from L2 cache 120 via crossbar interface 260. In one embodiment, data cache 235 may be configured as a write-through cache in which all stores are written to L2 cache 120 regardless of whether they hit in data cache 235; in some such embodiments, stores that miss in data cache 235 may cause an entry corresponding to the store data to be allocated within the cache. In other embodiments, data cache 235 may be implemented as a write-back cache.

In one embodiment, LSU 230 may include a miss queue configured to store records of pending memory accesses that have missed in data cache 235 such that additional memory accesses targeting memory addresses for which a miss is pending may not generate additional L2 cache request traffic. In the illustrated embodiment, address generation for a load/store instruction may be performed by one of EXUs 210. Depending on the addressing mode specified by the instruction, one of EXUs 210 may perform arithmetic (such as adding an index value to a base value, for example) to yield the desired address. Additionally, in some embodiments LSU 230 may include logic configured to translate virtual data addresses generated by EXUs 210 to physical addresses, such as a Data Translation Lookaside Buffer (DTLB).

Stream processing unit 240 may be configured to implement one or more specific data processing algorithms in hardware. For example, SPU 240 may include logic configured to support encryption/decryption algorithms such as Advanced Encryption Standard (AES), Data Encryption Standard/Triple Data Encryption Standard (DES/3DES), or Ron's Code #4 (RC4). SPU 240 may also include logic to implement hash or checksum algorithms such as Secure Hash Algorithm (SHA-1, SHA-256), Message Digest 5 (MD5), or Cyclic Redundancy Checksum (CRC). SPU 240 may also be configured to implement modular arithmetic such as modular multiplication, reduction and exponentiation. In one embodiment, SPU 240 may be configured to utilize the multiply array included in FGU 220 for modular multiplication. In various embodiments, SPU 240 may implement several of the aforementioned algorithms as well as other algorithms not specifically described.

SPU 240 may be configured to execute as a coprocessor independent of integer or floating-point instruction execution. For example, in one embodiment SPU 240 may be configured to receive operations and operands via control registers accessible via software; in the illustrated embodiment SPU 240 may access such control registers via LSU 230. In another embodiment SPU 240 may receive operations and operands decoded and issued from the instruction stream by IFU 200. In some embodiments, SPU 240 may be configured to freely schedule operations across its various algorithmic subunits independent of other functional unit activity. Additionally, SPU 240 may be configured to generate memory load and store activity. In the illustrated embodiment, SPU 240 may interact directly with crossbar interface 260 for such memory activity, while in other embodiments SPU 240 may coordinate memory activity through LSU 230. In one embodiment, software may poll SPU 240 through one or more control registers to determine result status and to retrieve ready results, for example by accessing additional control registers. In other embodiments, FGU 220, LSU 230 or other logic may be configured to poll SPU 240 at intervals to determine whether it has ready results to write back. In still other embodiments, SPU 240 may be configured to generate a trap when a result is ready, to allow software to coordinate result retrieval and processing.

As previously described, instruction and data memory accesses may involve translating virtual addresses to physical addresses. In one embodiment, such translation may occur on a page level of granularity, where a certain number of address bits comprise an offset into a given page of addresses, and the remaining address bits comprise a page number. For example, in an embodiment employing 4 MB pages, a 64-bit virtual address and a 40-bit physical address, 22 address bits (corresponding to 4 MB of address space, and typically the least significant address bits) may constitute the page offset. The remaining 42 bits of the virtual address may correspond to the virtual page number of that address, and the remaining 18 bits of the physical address may correspond to the physical page number of that address. In such an embodiment, virtual to physical address translation may occur by mapping a virtual page number to a particular physical page number, leaving the page offset unmodified.

Such translation mappings may be stored in an ITLB or a DTLB for rapid translation of virtual addresses during lookup of instruction cache 204 or data cache 235. In the event no translation for a given virtual page number is found in the appropriate TLB, memory management unit 250 may be configured to provide a translation. In one embodiment, MMU 250 may be configured to manage one or more translation tables stored in system memory and to traverse such tables (which in some embodiments may be hierarchically organized) in response to a request for an address translation, such as from an ITLB or DTLB miss. (Such a traversal may also be referred to as a page table walk.) In some embodiments, if MMU 250 is unable to derive a valid address translation, for example if one of the memory pages including a necessary page table is not resident in physical memory (i.e., a page miss), MMU 250 may be configured to generate a trap to allow a memory management software routine to handle the translation. It is contemplated that in various embodiments, any desirable page size may be employed. Further, in some embodiments multiple page sizes may be concurrently supported.

A number of functional units in the illustrated embodiment of core 100 may be configured to generate off-core memory or I/O requests. For example, IFU 200 or LSU 230 may generate access requests to L2 cache 120 in response to their respective cache misses. SPU 240 may be configured to generate its own load and store requests independent of LSU 230, and MMU 250 may be configured to generate memory requests while executing a page table walk. Other types of off-core access requests are possible and contemplated. In the illustrated embodiment, crossbar interface 260 may be configured to provide a centralized interface to the port of crossbar 110 associated with a particular core 100, on behalf of the various functional units that may generate accesses that traverse crossbar 110. In one embodiment, crossbar interface 260 may be configured to maintain queues of pending crossbar requests and to arbitrate among pending requests to determine which request or requests may be conveyed to crossbar 110 during a given execution cycle. For example, crossbar interface 260 may implement a least-recently-used or other algorithm to arbitrate among crossbar requestors. In one embodiment, crossbar interface 260 may also be configured to receive data returned via crossbar 110, such as from L2 cache 120 or I/O interface 140, and to direct such data to the appropriate functional unit (e.g., data cache 235 for a data cache fill due to miss). In other embodiments, data returning from crossbar 110 may be processed externally to crossbar interface 260.

During the course of operation of some embodiments of core 100, exceptional events may occur. For example, an instruction from a given thread that is picked for execution by pick unit 206 may be not be a valid instruction for the ISA implemented by core 100 (e.g., the instruction may have an illegal opcode), a floating-point instruction may produce a result that requires further processing in software, MMU 250 may not be able to complete a page table walk due to a page miss, a hardware error (such as uncorrectable data corruption in a cache or register file) may be detected, or any of numerous other possible architecturally-defined or implementation-specific exceptional events may occur. In one embodiment, trap logic unit 270 may be configured to manage the handling of such events. For example, TLU 270 may be configured to receive notification of an exceptional event occurring during execution of a particular thread, and to cause execution control of that thread to vector to a supervisor-mode software handler (i.e., a trap handler) corresponding to the detected event. Such handlers may include, for example, an illegal opcode trap handler configured to return an error status indication to an application associated with the trapping thread and possibly terminate the application, a floating-point trap handler configured to fix up an inexact result, etc.

In one embodiment, TLU 270 may be configured to flush all instructions from the trapping thread from any stage of processing within core 100, without disrupting the execution of other, non-trapping threads. In some embodiments, when a specific instruction from a given thread causes a trap (as opposed to a trap-causing condition independent of instruction execution, such as a hardware interrupt request), TLU 270 may implement such traps as precise traps. That is, TLU 270 may ensure that all instructions from the given thread that occur before the trapping instruction (in program order) complete and update architectural state, while no instructions from the given thread that occur after the trapping instruction (in program order) complete or update architectural state.

Exemplary Core Pipeline Diagram

In the illustrated embodiment, core 100 may be configured for pipelined execution, in which processing of new instructions may begin before older instructions have completed, such that multiple instructions from various threads may be in various stages of processing during a given core execution cycle. A pipeline diagram illustrating the flow of integer instructions through one embodiment of core 100 is shown in FIG. 3. In the illustrated embodiment, execution of integer instructions is divided into eight stages, denoted Fetch (F), Cache (C), Pick (P), Decode (D), Execute (E), Memory (M), Bypass (B), and Writeback (W). In other embodiments, it is contemplated that different numbers of pipe stages corresponding to different types of functionality may be employed. It is further contemplated that other pipelines of different structure and depth may be implemented for integer or other instructions. For example, floating-point instructions may execute in a longer pipeline than integer instructions.

The first four stages of the illustrated integer pipeline may generally correspond to the functioning of IFU 200. In one embodiment, during the Fetch stage, one or more threads to fetch may be selected, and instruction cache 204 may be accessed for the selected thread. During the Cache stage, fetch unit 202 may determine whether the access of the previous cycle hit or missed the cache. If the access hit, the instructions read from the cache may be stored in instruction buffers. During the Pick stage, pick unit 206 may be configured in one embodiment to select at most two instructions to issue, one for each thread group as described above. Source dependencies of the selected instructions on previously issued instructions may also be detected during the Pick stage. During the Decode stage, decode unit 208 may be configured to decode the selected instructions and to determine whether resource hazards exist as described above. For integer operations, data operands may also be selected during the Decode stage. For example, operands may be retrieved from an integer register file, or bypass logic may be configured to bypass operands from another pipe stage.

During the Execute stage, one or both of execution units 210 may be active to compute an instruction result. If an instruction in the integer execution pipeline is not a load or store instruction, in the illustrated embodiment it may be idle during the Memory and Bypass stages before its result is committed (i.e., written back to the integer register file) in the Writeback stage. A load or store instruction may have its address calculated by one of execution units 210 during the Execute stage. During the Memory stage of a load instruction, data cache 235 may be accessed, while during the Bypass stage, LSU 230 may determine whether a data cache hit or miss occurred. In the hit case, data may be forwarded to the appropriate execution unit 210 (e.g., dependent on the thread group of the load instruction) to be committed during the Writeback stage. In one embodiment, store instructions and load instructions that miss data cache 235 may execute with different pipeline timing than shown in FIG. 3.

In the illustrated embodiment, integer instructions are depicted as executing back-to-back in the pipeline without stalls. In execution cycles 0 through 7, instructions from threads 0, 3, 6, 2, 7, 5, 1 and 4 enter the Fetch stage, respectively, though in other embodiments, instructions may issue from various threads in a different order according to the operation of pick unit 206. In some instances, other instructions issued prior to execution cycle 0 may also be in the pipeline. Additionally, in some embodiments, two different instructions from the same or different threads may execute during the same pipeline stage. For example, in the illustrated embodiment of core 100, one integer instruction may be issued to each of execution units 210 in a single cycle.

By execution cycle 7, it is noted that each stage of the pipeline holds an instruction from a different thread in a different stage of execution, in contrast to conventional processor implementations that typically require a pipeline flush when switching between threads or processes. In some embodiments, flushes and stalls due to resource conflicts or other scheduling hazards may cause some pipeline stages to have no instruction during a given cycle. However, in the fine-grained multithreaded processor implementation employed by the illustrated embodiment of core 100, such flushes and stalls may be directed to a single thread in the pipeline, leaving other threads undisturbed. Additionally, even if one thread being processed by core 100 stalls for a significant length of time (for example, due to an L2 cache miss), instructions from another thread may be readily selected for issue, thus increasing overall thread processing throughput.

Floating-Point Addition Path

Figure 4:
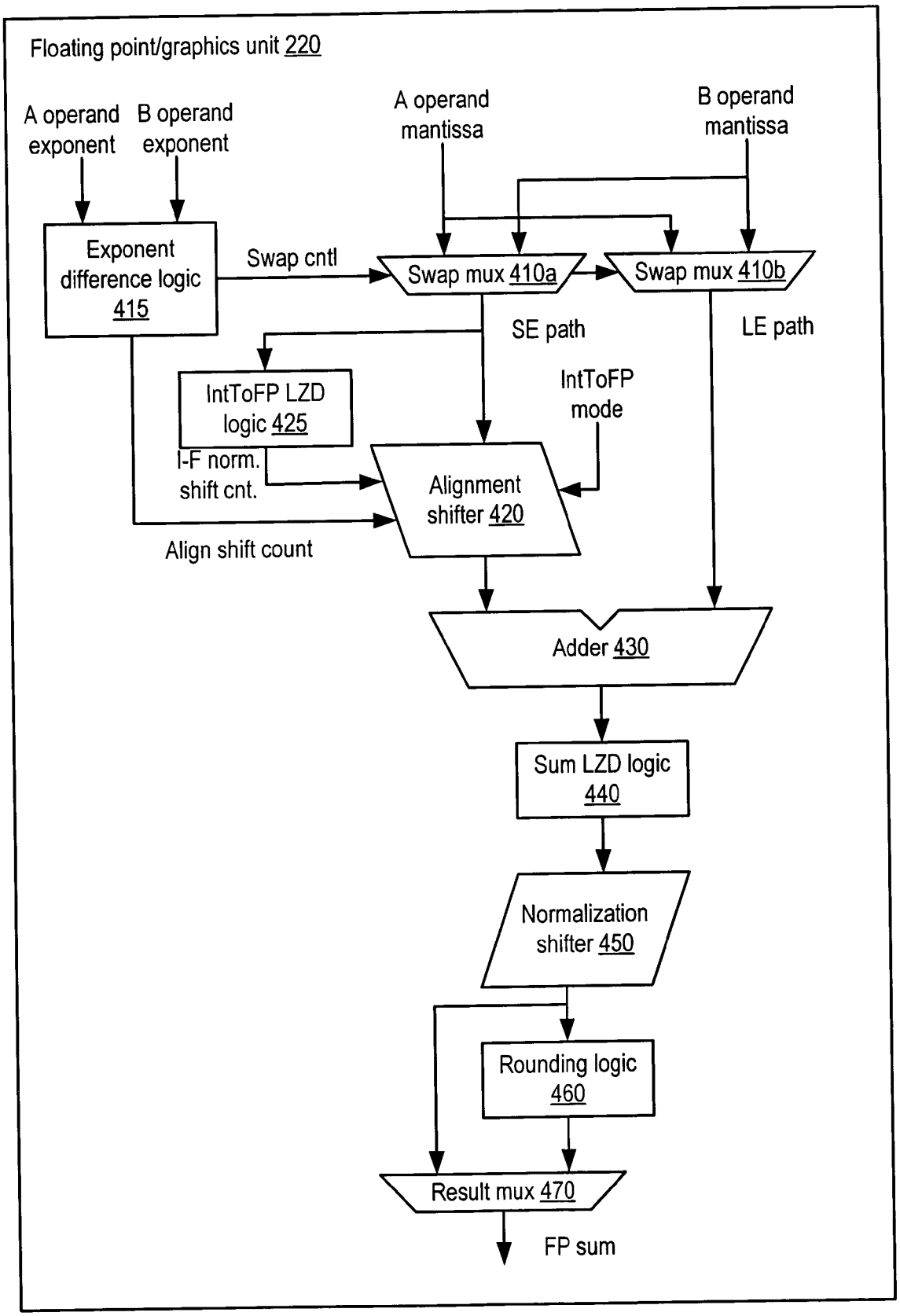
FIG. 4 is a block diagram illustrating one embodiment of floating point addition logic configured for serial rounding.

As noted above, in various embodiments FGU 220 may be configured to perform various kinds of floating-point operations, such as addition and/or multiplication. One embodiment of FGU 220 illustrating floating-point addition logic is shown in FIG. 4. In the illustrated embodiment, FGU 220 includes a pair of swap muxes 410a-b, each coupled to the mantissa portions of two floating-point operands designated A and B. The exponent portions of operands A and B are coupled to exponent difference logic 415, which is coupled to control swap muxes 410a-b. The output of swap mux 410a, also designated the smaller-exponent or SE path, is coupled to an alignment shifter 420 as well as to integer-to-floating-point leading-zero-detect (IntToFP LZD) logic 425. Both exponent difference logic 415 and IntToFP LZD logic 425 are coupled to convey respective shift counts to alignment shifter 420, which is also coupled to receive an IntToFP mode control signal.

Both swap mux 410b, also designated the larger-exponent or LE path, and alignment shifter 420 are coupled to adder 430. The output of adder 430 passes through sum leading-zero-detect (LZD) logic 440 as well as normalization shifter 450 and rounding logic 460. In the illustrated embodiment, result mux 470 selects the floating-point sum result from either normalization shifter 450 or rounding logic 460. In other embodiments, it is contemplated that FGU 220 may include other logic not shown, either in the addition path or to perform other operations such as multiplication, division, etc.

In many embodiments of floating-point addition logic, the two floating-point mantissas are aligned with one another prior to their being added. That is, one or both mantissas are shifted, adjusting corresponding operand exponents accordingly, until both exponents are equal. In the illustrated embodiment, the operand having the smaller exponent (i.e., the numerically lesser exponent) may be aligned to the operand having the larger exponent by shifting the mantissa of the smaller-exponent operand towards the least significant bit (LSB) position (which is typically the rightmost bit position of a number, but may occupy another position in various embodiments). Since shifting a binary number by one bit position towards the LSB is equivalent to division by two, incrementing the exponent of the smaller-exponent operand by one for each bit position the mantissa is shifted (i.e., effectively multiplying the mantissa by two) preserves the value of the smaller-exponent operand. In case both exponents are already equal prior to alignment, no alignment may be necessary, and either operand may be considered the smaller-exponent operand.

In the illustrated embodiment, the alignment shift count (i.e., the number of bit positions by which to shift the mantissa of the smaller-exponent operand) may be determined by exponent difference logic 415 (or simply, difference logic 415). In one embodiment, difference logic 415 may be configured to determine the difference of the exponents of operands A and B. For example, difference logic 415 may subtract exponent B from exponent A, or vice versa, to determine the alignment shift count. In one embodiment, both exponents may be represented as signed numbers. In such an embodiment, if difference logic 415 subtracts exponent B from exponent A and the resulting alignment shift count is positive (i.e., greater than zero), operand B may be designated the smaller-exponent operand, while if the resulting alignment shift count is negative (i.e., less than zero), operand A may be designated the smaller-exponent operand. (If the result is zero, both exponents were already equal and no alignment may be needed.) In another embodiment, both exponents may be represented as positive, biased numbers. In such an embodiment, rather than comparing the difference against zero to determine the smaller-exponent operand, the difference may be compared against the bias value. In various embodiments, the resulting alignment shift count may be represented in two's complement form, sign/magnitude form, or another suitable arithmetic representation.

For any given addition operation, either operand A or operand B may be the smaller-exponent operand. Rather than provide an aligner for each operand, in the illustrated embodiment, swap mux 410a may be configured to route the mantissa of the smaller-exponent operand, as determined by difference logic 415, to the SE path to be aligned, while swap mux 410b may be configured to route the mantissa of the larger-exponent operand to the LE path. It is contemplated that in some embodiments, the illustrated adder logic may be configured to perform subtraction as well as addition, for example by complementing the mantissa to be subtracted and adding 1 to the LSB of the sum. In various such embodiments, complementation for subtraction may occur prior to or following alignment.

Once selected by swap mux 410*a*, the mantissa of the smaller-exponent operand may be aligned by alignment shifter 420 dependent on the exponent difference (i.e., the alignment shift count) determined by difference logic 415. In one embodiment, alignment shifter 420 may be configured for a first mode of operation in which the smaller-exponent mantissa is shifted towards the LSB position dependent upon the alignment shift count. In the illustrated embodiment, the first mode of operation may apply when FGU 220 is not executing an instruction to convert an integer operand to floating-point format, which may correspond to deassertion of the IntToFP mode control input to alignment shifter 420. In various embodiments, the IntToFP mode control signal may be determined by other logic within FGU 220, or may be a control signal decoded from an instruction upon issue from IFU 200 to FGU 220 (e.g., by decode unit 208). Operation of alignment shifter 420 when the IntToFP mode control input is asserted, as well as operation of IntToFP LZD logic 425, is described below.

Following alignment of the smaller-exponent mantissa, both mantissas may be added by adder 430. In various embodiments, adder 430 may employ any suitable architecture or design style. For example, adder 430 may be a carry lookahead adder or a carry select adder. Also, in some embodiments adder 430 may include other control or data inputs, such as a programmable carry-in input that may be used during subtraction.

In many floating-point representation formats, such as IEEE 754, floating-point operands are normalized if it is possible to do so within the precision defined for the operand. In one embodiment a floating-point number is normalized if the most significant bit (MSB) of its mantissa is equal to one. (In some embodiments, such as IEEE 754, the most significant bit of the mantissa is not expressly represented, but is rather implied to have a value of one.) Depending on the arithmetic operation being performed, the sum produced by adder 430 may not be normalized (for example, in the case of subtraction of relatively close numbers, an arbitrary number of mantissa bits may be cancelled). Therefore, in the illustrated embodiment, sum LZD logic 440 and normalization shifter 450 are provided for sum normalization.

In one embodiment, sum LZD logic 440 may be configured to determine a count of leading zeros in the sum produced by adder 430. That is, sum LZD logic 440 may be configured to count the number of zero bits in the sum beginning with the MSB position. Sum LZD logic 440 may be configured to convey this count along with the sum to normalization shifter 450. In one embodiment, normalization shifter 450 may be configured to normalize the sum by shifting it towards the MSB position by the shift count determined by sum LZD logic 440.

Because the number of mantissa bits available in any given floating-point representation format is finite, not all possible sums may be represented exactly. For example, the exact binary representation of certain rational floating-point fractions may require an infinite number of mantissa bits for exact representation, and may be only inexactly represented with a finite mantissa. In the illustrated embodiment, rounding logic 460 may be configured to round inexact sums according to a rounding mode. For example, IEEE 754 defines a plurality of rounding modes including round to nearest, round to zero, round to positive infinity, and round to negative infinity. In some embodiments, additional bits of precision less significant than the LSB of the mantissa may be preserved during alignment, addition, and normalization. For example, in one embodiment a guard bit, a rounding bit, and a sticky bit may be implemented. Rounding logic 460 may be configured to take these additional bits of precision into account and to increment the LSB or one of the additional bits of precision according to the rounding mode currently in effect.

Finally, in the illustrated embodiment result mux 470 may be configured to select either the rounded result or the normalized result without rounding as the mantissa of the final floating-point sum. In various embodiments, the exponent and sign of the floating-point sum may be determined by other elements, or these may be incorporated in existing logic such as difference logic 415, for example. (In some cases, the value of the larger exponent to which the smaller-exponent mantissa was aligned may be adjusted following addition, normalization, or rounding, for example if a normalization shift is necessary or an overflow occurs.) In some embodiments, it is contemplated that the above-described logic may be implemented as a pipeline including a number of pipeline stages, each of which may include a different instruction from a different thread, such as illustrated in FIG. 3. In some such embodiments, pipeline registers may be inserted within or between various units illustrated in FIG. 4 to facilitate pipelining.

Figure 5:
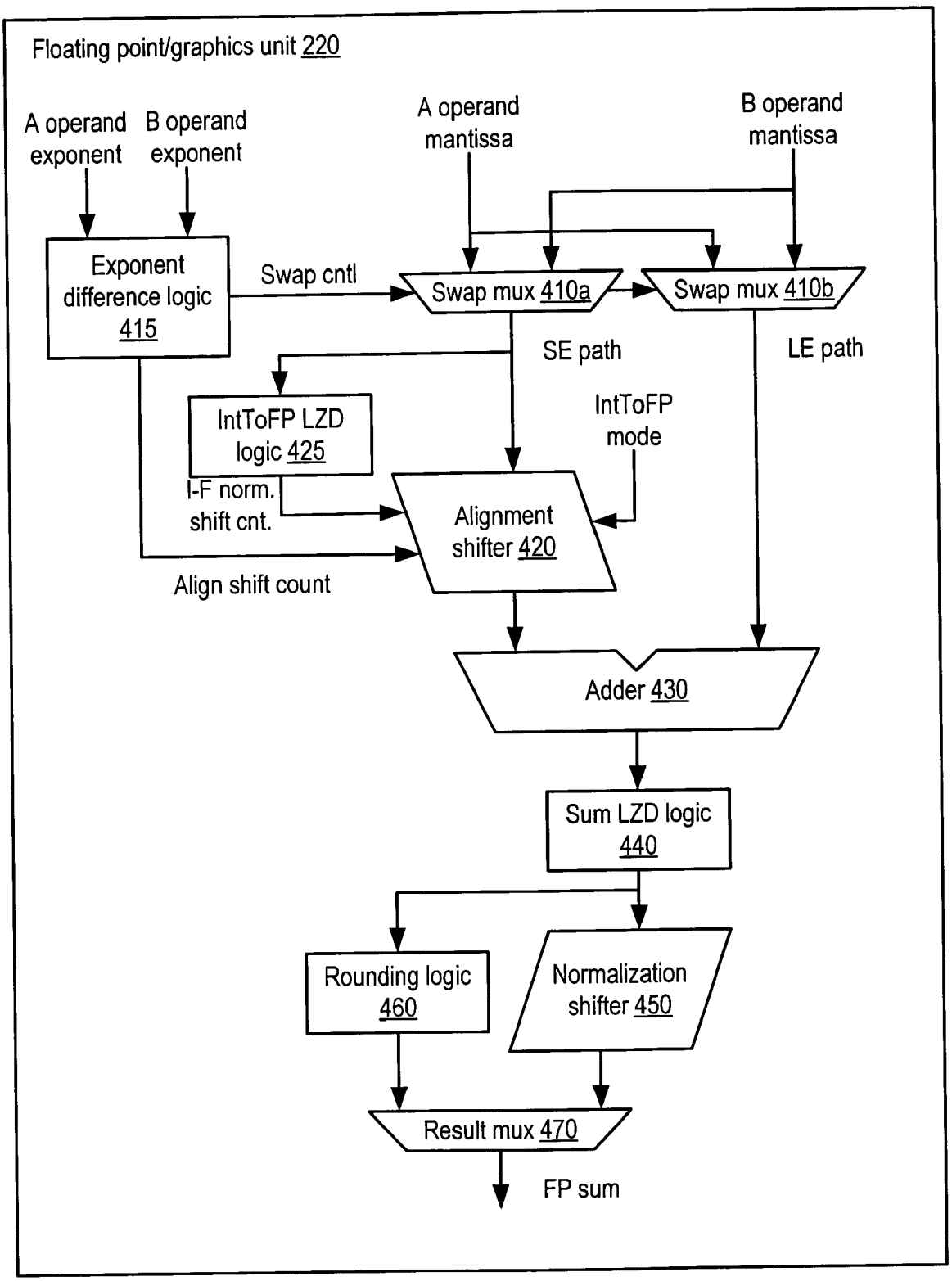
FIG. 5 is a block diagram illustrating one embodiment of floating point addition logic configured for parallel rounding.

In the embodiment illustrated in FIG. 4, normalization and rounding are performed in series (which may also be referred to as a serial round organization), and the worst-case latency incurred to produce a sum includes the latencies of both of these steps. In alternative embodiments, different rounding schemes may be employed. For example, if floating-point addition input operands are assumed to be normalized, then in general it may be the case that the sum result may require either a large normalization shift (e.g., by more than 1 bit position) or rounding, but not both operations. In the embodiment of FIG. 5, this property is leveraged by configuring normalization shifter 450 and rounding logic 460 to operate in parallel, which may also be referred to as a parallel round organization. (In some instances, a rounded result may require a normalization shift by a small amount, such as one bit position, but this limited shift may be implemented within rounding logic 460 or result mux 470 in some embodiments.) Consequently, a given addition operation may not incur the latency of both rounding and a full normalization shift.

Figure 6:
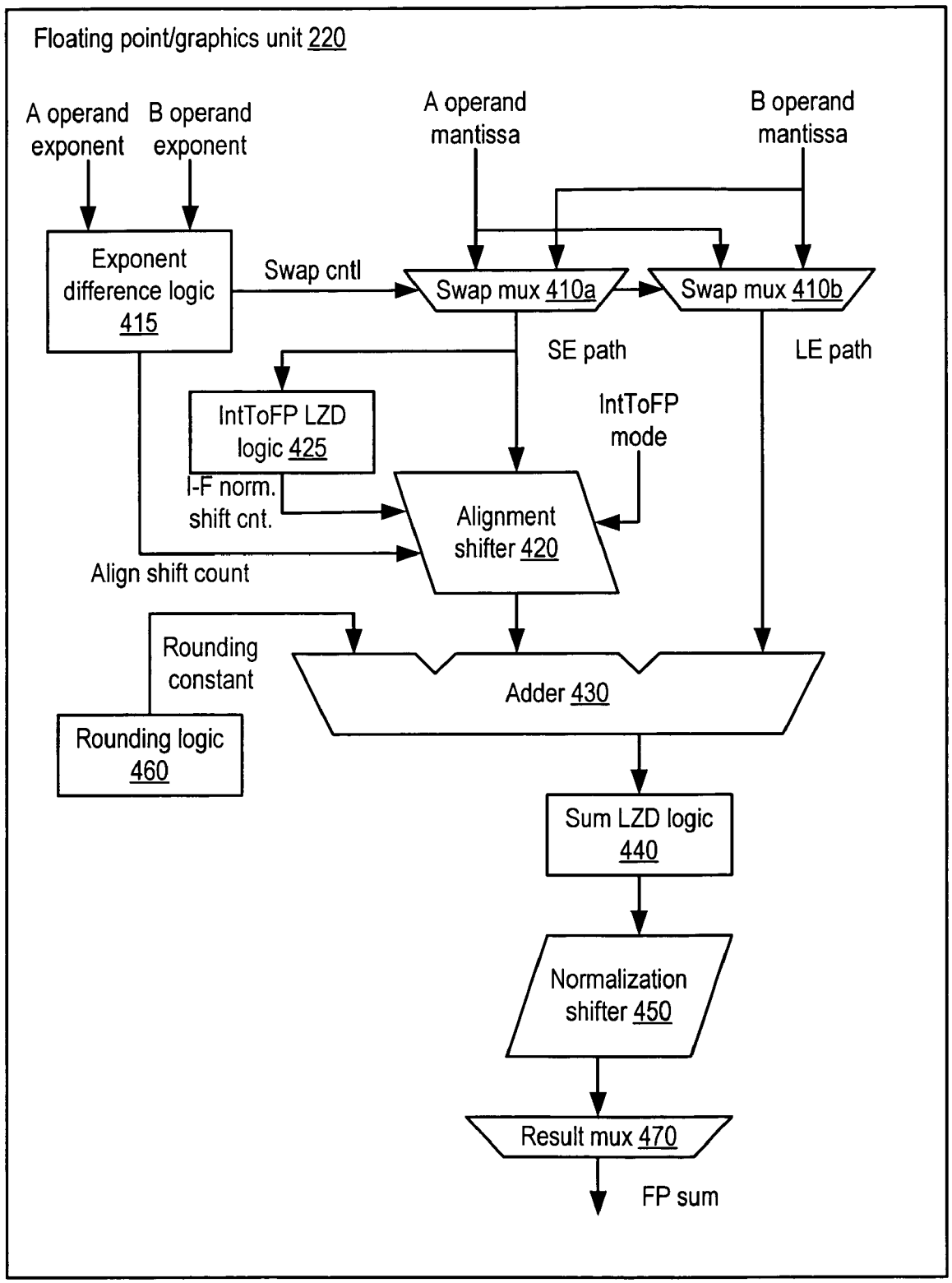
FIG. 6 is a block diagram illustrating one embodiment of floating point addition logic configured for early rounding.

In another embodiment, if the need for rounding and a large normalization shift can be assumed to be mutually exclusive or orthogonal as just mentioned, the location at which a rounding increment should occur if rounding is required may be determinable during the addition process. In such an embodiment, an appropriate rounding constant (which typically includes a one in the bit position to be incremented due to rounding, and zeroes elsewhere) may be added along with the A and B operand mantissas, so that rounding is incorporated into the addition process. One such embodiment, which may also be referred to as an early round organization, is illustrated in FIG. 6, in which rounding logic 460 is configured to provide an appropriate rounding constant to adder 430.

In some embodiments performing early rounding, adder 430 may be configured to produce both a rounded and an unrounded sum. For example, adder 430 may be a carry select adder configured to produce both A+B and A+B+1 results. In some such embodiments, one of the two sums may be selected within adder 430 dependent upon whether rounding is detected to be necessary, which may in turn depend on the values of rounding bits, the rounding mode in effect, result sign, carry out of adder 430, and other factors. In other embodiments, the rounded or unrounded sum may be selected at a later stage, such as in result mux 470. In some such embodiments, the rounded sum may or may not bypass normalization shifter 450.

Integer to Floating-Point Conversion

In some software applications, it may be necessary or convenient to perform floating-point calculations on data that is originally formatted in an integer representation. Many ISAs provide instructions for the conversion of an integer operand to floating-point format (e.g., single or double precision) and vice versa. However, unlike many floating-point representation formats, integer operands are not generally stored in a normalized format. Thus, a given integer operand may require a large normalization shift during conversion to a floating point mantissa value.

Depending on the floating-point precision chosen to represent the integer operand, some integer operands may not be capable of exact representation in floating-point format. For example, IEEE 754 single precision format provides a maximum effective mantissa width of 24 bits (23 explicit bits with an implicit MSB of one). Thus, some integer values wider than 24 bits may be rounded upon conversion to single precision format.

It is noted that under some circumstances, conversion of an integer operand to floating-point format may require both a large normalization shift and a rounding operation, contrary to the assumption of orthogonality of these tasks that may be made for floating-point operands as described above. Accommodating integer-to-floating-point (IntToFP) conversion in some embodiments optimized around that assumption, such as the parallel embodiment of FIG. 5, may require additional logic configured to serially pass the integer operand undergoing conversion through normalization shifter 450 followed by rounding logic 460. Such an accommodation may result in the conversion instruction taking an extra execution cycle relative to other floating-point instructions, creating asymmetry in execution latency and a potential pipeline hazard/stall condition in pipelined embodiments. Alternatively, the serial rounding technique illustrated in the embodiment of FIG. 4 may be employed for all floating-point instructions, at the cost of incurring both normalization and rounding latency for all instructions as described previously, or a dedicated normalization shifter may be constructed to prenormalize integer operands, at the cost of additional implementation area and power for the dedicated logic.

As described above, alignment shifter 420 may be configured in some embodiments to shift a smaller-exponent floating-point operand towards the LSB position in order to align it with a larger-exponent floating-point operand, during one mode of operation. In one embodiment, alignment shifter 420 may be configured for a second mode of operation in which it may normalize an integer operand (such as may be the argument of an integer-to-floating-point conversion instruction) by shifting the integer operand towards the MSB position.

In the embodiments of FGU 220 illustrated in FIGS. 4-6, IntToFP LZD logic 425 may be configured to determine a count of leading zeros of an integer operand. For example, during execution of an integer-to-floating-point format conversion instruction, difference logic 415 may be configured to route the integer operand through swap mux 410a. Subsequently, IntToFP LZD logic 425 may determine the integer operand's leading zero count. This leading zero count may represent the number of bit positions towards the MSB to shift the integer operand in order to normalize it. In the illustrated embodiment, alignment shifter 420 may be configured to perform this normalization shift, which occurs in a direction logically opposite the alignment shift described above.

Specifically, in one embodiment alignment shifter 420 may be configured as a rotator during conversion of integer operands to floating-point format. Generally speaking, while ordinary shifters may discard bits of the shift operand that are shifted out of the MSB or LSB positions (depending on the direction of the shift), rotators may cause a bit shifted out of the LSB position to be inserted at the MSB position, or vice versa. In some embodiments, logically shifting an N-bit operand by M bit positions in one direction is equivalent to rotating the N-bit operand by N-M (i.e., the two's complement of M) bits in the opposite direction. In the illustrated embodiment, when the IntToFP mode control signal is asserted, alignment shifter 420 may be configured to select the leading zero count from IntToFP LZD logic 425 instead of the alignment shift count from difference logic 415. Further, during this mode, alignment shifter 420 may be configured to normalize an integer operand (i.e., to shift the integer operand towards the MSB position) by rotating the operand towards the LSB position by the two's complement of the leading zero count determined by IntToFP LZD logic 425. (In various embodiments, either IntToFP LZD logic 425 or alignment shifter 420 may be configured to perform the two's complement of this leading zero count.) Separate exponent logic, such as difference logic 415 or other exponent logic, may be configured to decrement the exponent corresponding to the integer operand mantissa by one for each bit position the integer operand is shifted during normalization.

In some embodiments, the integer operand to be converted may be represented in a signed two's complement format, whereas the floating-point format may use a sign-magnitude representation (e.g., a sign bit and an unsigned mantissa). In one such embodiment, if the integer operand is negative, IntToFP LZD logic 425 may apply a one's complement operation to the integer operand prior to determining its leading zero count. Further, in such an embodiment, if the integer operand is negative, alignment shifter 420 may be configured to logically invert (i.e., one's complement) all bits rotated from the LSB position to the MSB position of the integer operand during the normalization shift. Subsequently, adder 430 may be configured to add a value of one to the LSB of the normalized integer operand (or to the least significant of the additional rounding bits appended to the operand, if present), resulting in an unsigned (i.e., positive) mantissa.

It is noted that, in an embodiment configured to perform a one's complement of a negative two's complement integer operand prior to counting leading zeros, the resulting leading zero count in certain instances may be one greater than the count needed to normalize the integer operand. However, in some embodiments this situation may be detected and handled similarly to an overflow condition resulting from an ordinary addition operation. For example, in various embodiments, an overflow or carry out from adder 430 may cause the resulting mantissa to be shifted one bit position towards the LSB (and the exponent to be adjusted accordingly) during the normalization, rounding, or result muxing steps.

Once the integer operand has been normalized by alignment shifter 420 as just described, it may be added to zero (or one if negative, as described above) in adder 430.

If necessary, the integer operand may be rounded according to serial round, parallel round, or early round configurations illustrated in FIGS. 4-6, respectively. Finally, the integer operand may emerge from result mux 470 formatted as a normalized, rounded floating-point mantissa, which may be merged with a separately-determined exponent and sign bit to form a floating-point representation of the original integer operand. It is noted that by configuring alignment shifter 420 to perform a normalization shift of the integer operand, such a shift need not be performed by normalization shifter 450. Consequently, the integer operand may be rounded, if necessary, in adders that are organized around the assumption that the need for rounding and for a large normalization shift of a given sum are orthogonal, such as the parallel round and early round embodiments illustrated in FIGS. 5 and 6, respectively. In some such embodiments, integer-to-floating-point conversion instructions may be configured to execute in the same latency as other floating point addition instructions, and no separate integer normalization shifter may be required.

Figure 7:
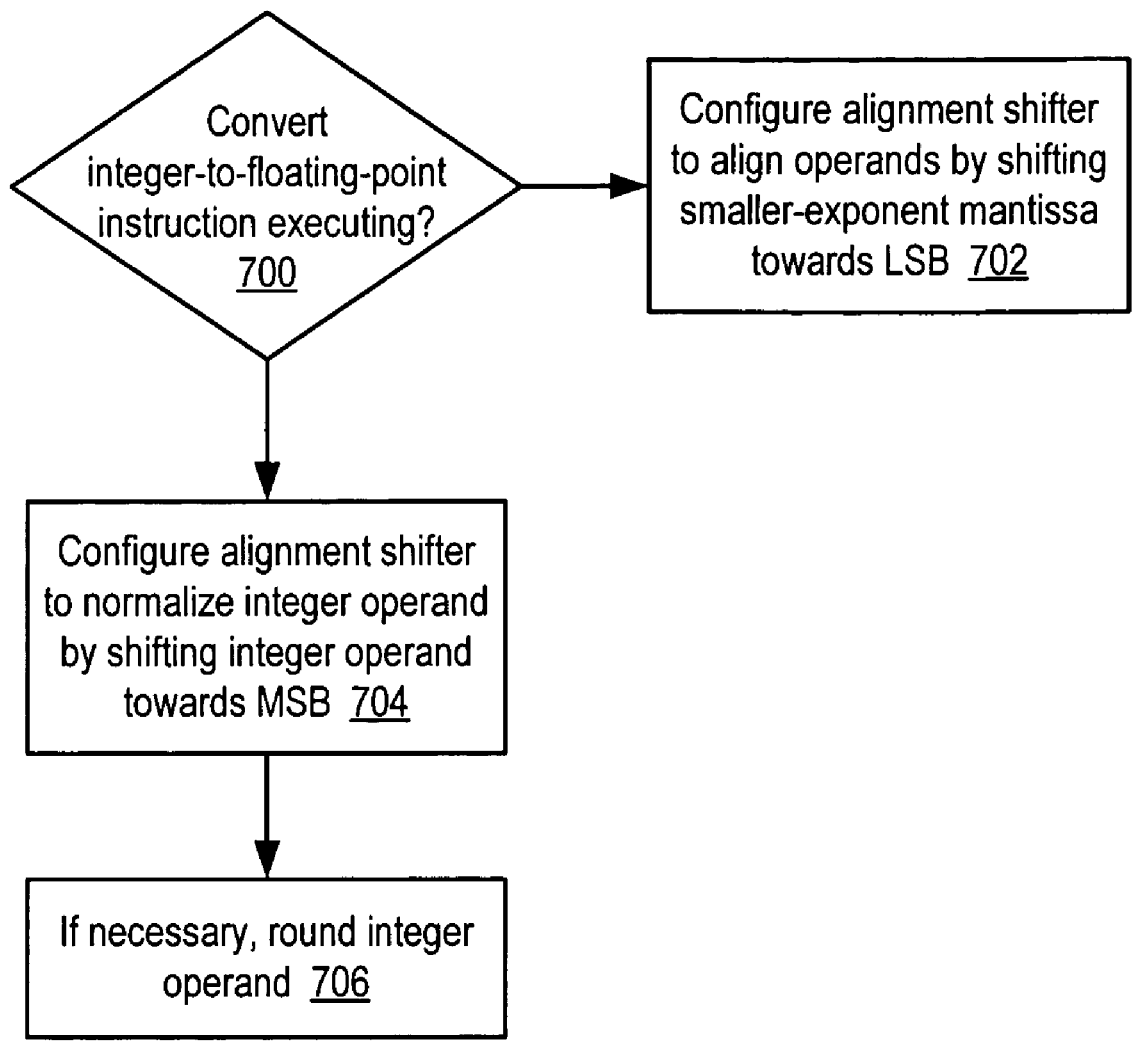
FIG. 7 is a flow diagram illustrating one embodiment of a method of converting an integer operand to a floating-point format.
Figure 8:
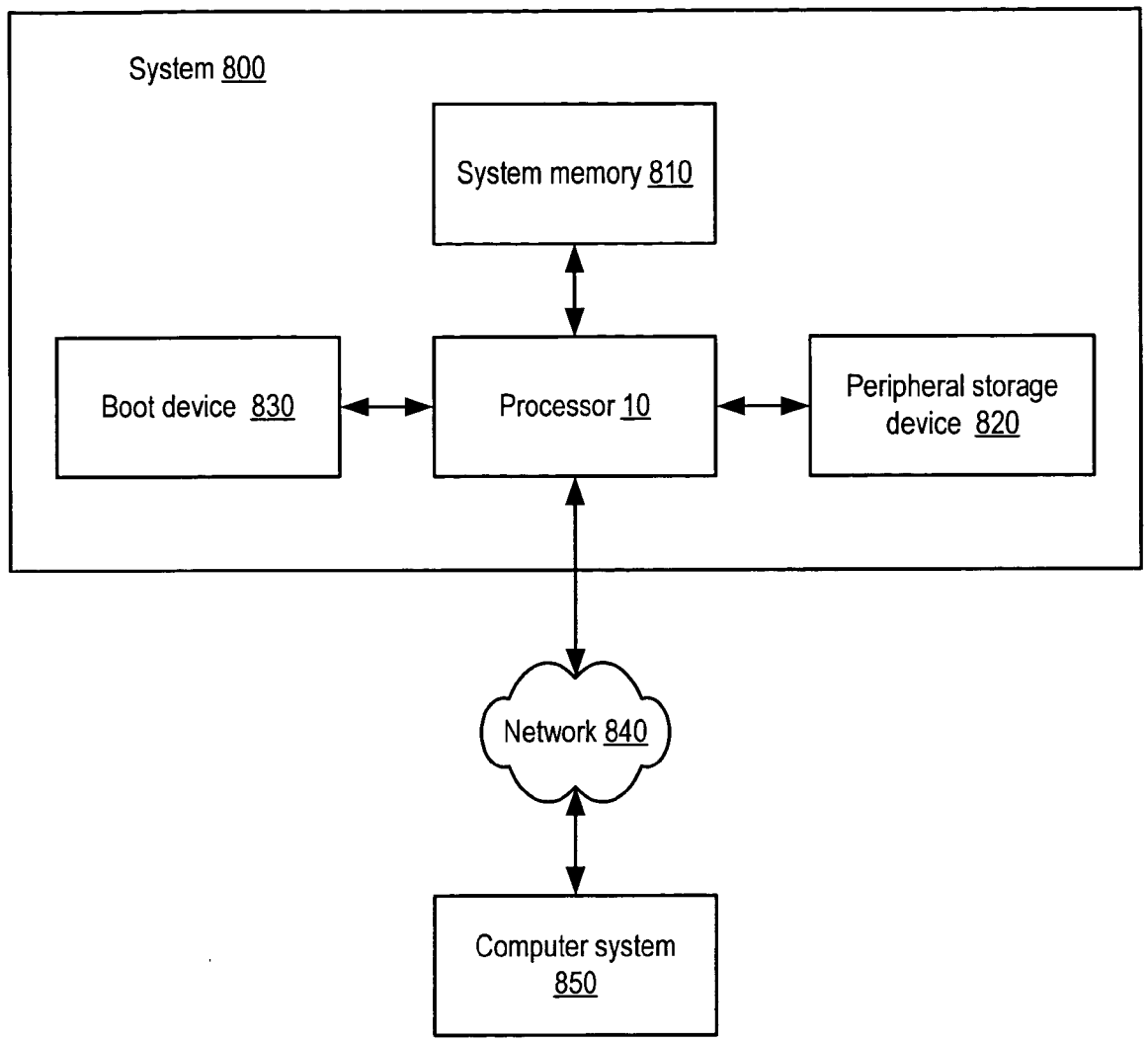
FIG. 8 is a block diagram illustrating one embodiment of a system including a multithreaded processor.

One embodiment of a method of normalizing an integer operand is illustrated in FIG. 7. Referring collectively to FIGS. 1-7, operation begins in block 700 in which it is determined whether an instruction to convert an integer operand to floating-point format is executing. For example, in one embodiment, when such an instruction is issued to FGU 220, a corresponding IntToFP mode signal may be asserted.

If such a conversion instruction is not executing (for example, if a regular floating-point addition instruction is executing), alignment shifter 420 is configured to align two floating point operands by shifting the respective mantissa of the smaller-exponent operand towards the least significant bit position (block 702). For example, difference logic 415 may be configured to determine a difference of respective exponents of the floating point operands as described above, and the alignment shift may be dependent on the exponent difference.

If such a conversion instruction is executing, alignment shifter 420 is configured to normalize an integer operand by shifting the integer operand towards the most significant bit position (block 704). For example, IntToFP LZD logic 425 may be configured to determine a count of leading zeros of the integer operand, and the normalization shift may be dependent upon this count. As described above, in some embodiments the normalization shift of the integer operand may be implemented by rotating the integer operand towards the least significant bit position. Subsequent to normalization, the integer operand may be rounded if necessary (block 706).

Exemplary System Embodiment

As described above, in some embodiments processor 10 of FIG. 1 may be configured to interface with a number of external devices. One embodiment of a system including processor 10 is illustrated in FIG. 6. In the illustrated embodiment, system 800 includes an instance of processor 10 coupled to a system memory 810, a peripheral storage device 820 and a boot device 830. System 800 is coupled to a network 840, which is in turn coupled to another computer system 850. In some embodiments, system 800 may include more than one instance of the devices shown, such as more than one processor 10, for example. In various embodiments, system 800 may be configured as a rack-mountable server system, a standalone system, or in any other suitable form factor. In some embodiments, system 800 may be configured as a client system rather than a server system.

In various embodiments, system memory 810 may comprise any suitable type of system memory as described above, such as FB-DIMM, DDR/DDR2 SDRAM, or RDRAM®, for example. System memory 810 may include multiple discrete banks of memory controlled by discrete memory interfaces in embodiments of processor 10 configured to provide multiple memory interfaces 130. Also, in some embodiments system memory 810 may include multiple different types of memory.

Peripheral storage device 820, in various embodiments, may include support for magnetic, optical, or solid-state storage media such as hard drives, optical disks, nonvolatile RAM devices, etc. In some embodiments, peripheral storage device 820 may include more complex storage devices such as disk arrays or storage area networks (SANs), which may be coupled to processor 10 via a standard Small Computer System Interface (SCSI), a Fibre Channel interface, a Firewire® (IEEE 1394) interface, or another suitable interface. Additionally, it is contemplated that in other embodiments, any other suitable peripheral devices may be coupled to processor 10, such as multimedia devices, graphics/display devices, standard input/output devices, etc.

As described previously, in one embodiment boot device 830 may include a device such as an FPGA or ASIC configured to coordinate initialization and boot of processor 10, such as from a power-on reset state. Additionally, in some embodiments boot device 830 may include a secondary computer system configured to allow access to administrative functions such as debug or test modes of processor 10.

Network 840 may include any suitable devices, media and/or protocol for interconnecting computer systems, such as wired or wireless Ethernet, for example. In various embodiments, network 840 may include local area networks (LANs), wide area networks (WANs), telecommunication networks, or other suitable types of networks. In some embodiments, computer system 850 may be similar to or identical in configuration to illustrated system 800, whereas in other embodiments, computer system 850 may be substantially differently configured. For example, computer system 850 may be a server system, a processor-based client system, a stateless "thin" client system, a mobile device, etc.

In the foregoing discussion, references made to values such as zero or one refer to arithmetic values. It is contemplated that in various embodiments, a given arithmetic value may be implemented using either positive logic, in which logic values '1' and '0' correspond respectively to arithmetic values one and zero, or negative logic, in which this correspondence is inverted. It is further contemplated that any other suitable signaling scheme for conveying arithmetic values may be employed.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A processor, comprising:
an adder configured to perform addition of respective mantissas of two floating-point operands to produce a sum, wherein a smaller-exponent one of said floating-point operands has a respective exponent less than or equal to a respective exponent of a larger-exponent one of said floating-point operands;
an alignment shifter coupled to provide an input to said adder and configured, in a first mode of operation that is active during execution of a floating-point addition instruction, to align said floating-point operands prior to said addition by shifting the respective mantissa of said smaller-exponent operand towards a least-significant bit position; and
a rounding circuit configured to round said sum and a normalization circuit configured to normalize said sum, wherein said rounding circuit and said normalization circuit are configured such that during execution of any floating-point addition instruction, either said normalization circuit is operable to perform a normalization shift of said sum by more than one bit position, or said rounding circuit is operable to round said sum, but not both;

wherein said adder, said alignment shifter, said rounding circuit, and said normalization circuit are included within a floating-point adder pipeline comprising a plurality of pipeline stages, wherein the floating-point adder pipeline is configured to concurrently process multiple floating-point addition instructions that concurrently occupy different pipeline stages;

wherein said adder is operable, during execution of an instruction to convert an integer operand to floating-point format, to produce a result of conversion of said integer operand as said sum, wherein for at least some values of said integer operand, conversion of said integer operand to floating-point format requires both a normalization shift by more than one bit position and rounding, and wherein said rounding circuit is configured to round said result of conversion of said integer operand;

wherein said alignment shifter is further configured, in a second mode of operation that is active during execution of said instruction to convert said integer operand to floating-point format, to perform said normalization shift required by said conversion prior to said adder producing said result of conversion of said integer operand as said sum, such that execution of said instruction to convert said integer operand to floating-point format does not require additional execution latency relative to execution of said floating-point addition instruction.

2. The processor as recited in claim 1, further comprising exponent difference logic configured to determine a difference of said respective exponents of said floating-point operands and to determine said smaller-exponent operand of said floating-point operands, wherein said alignment shifter is further configured to align said floating-point operands dependent upon said difference.

3. The processor as recited in claim 1, further comprising leading-zero-detect logic configured to determine a count of leading zeros of said integer operand, wherein said alignment shifter is further configured to perform said normalization shift required by said conversion dependent upon said count.

4. The processor as recited in claim 1, wherein said alignment shifter is configured as a rotator, and wherein to perform said normalization shift required by said conversion, said alignment shifter is further configured to rotate said integer operand towards said least significant bit position.

5. The processor as recited in claim 1, wherein said rounding circuit is further configured to round said sum by providing a rounding constant to said adder to be added along with said respective mantissas.

6. The processor as recited in claim 1, wherein said rounding circuit and said normalization circuit are coupled in parallel to an output of said adder.

7. The processor as recited in claim 1, further comprising instruction fetch logic configured to issue said instruction to convert said integer operand to floating-point format, wherein said instruction fetch logic is further configured to issue a first instruction from one of a plurality of threads during one execution cycle and to issue a second instruction from another one of said plurality of threads during a successive execution cycle.

8. A method, comprising:

during execution of a floating-point addition instruction:
an alignment shifter aligning two floating-point operands having respective mantissas by shifting the respective mantissa of a smaller-exponent one of said floating point operands towards a least-significant bit position;

an adder adding said floating-point operands after said aligning to produce a sum; and either a rounding circuit rounding said sum or a normalization circuit performing a normalization shift of said sum by more than one bit position, wherein said rounding circuit and said normalization circuit are physically configured such that during execution of any floating-point addition instruction, either said normalization circuit performs said normalization shift or said rounding circuit performs said rounding, but not both;

wherein said adder, said alignment shifter, said rounding circuit, and said normalization circuit are included within a floating-point adder pipeline comprising a plurality of pipeline stages, wherein the floating-point adder pipeline concurrently processes multiple floating-point addition instructions that concurrently occupy different pipeline stages;

during execution of an instruction to convert an integer operand to floating-point format, wherein conversion of said integer operand to floating-point format requires, for at least some values of said integer operand, both a normalization shift by more than one bit position and rounding:

prior to said adder producing a result of said instruction to convert said integer operand, said alignment shifter performing said normalization shift of said integer operand required by said conversion; and said adder producing a result of conversion of said integer operand as said sum and said rounding circuit rounding said result of conversion of said integer operand, such that executing said instruction to convert said integer operand to floating-point format does not require additional execution latency relative to executing said floating-point addition instruction;

wherein said smaller-exponent operand has a respective exponent less than or equal to a respective exponent of a larger-exponent one of said floating-point operands.

9. The method as recited in claim 8, further comprising determining a difference of said respective exponents of said floating-point operands, wherein said aligning during execution of said floating-point addition instruction is dependent upon said difference.

10. The method as recited in claim 8, further comprising determining a count of leading zeros of said integer operand, wherein said performing said normalization shift of said integer operation is dependent upon said count.

11. The method as recited in claim 8, wherein performing said normalization shift required by said conversion comprises rotating said integer operand towards said least significant bit position.

12. The method as recited in claim 8, further comprising wherein said rounding circuit rounding said sum comprises said rounding circuit providing a rounding constant to said adder to be added along with said respective mantissas.

13. The method as recited in claim 8, wherein said rounding circuit and said normalization circuit are coupled in parallel to an output of said adder.

14. The method as recited in claim 8, further comprising:
issuing an instruction from one of a plurality of threads during one execution cycle; and
issuing another instruction from another one of said plurality of threads during a successive execution cycle.

15. A system, comprising:

a system memory; and a processor coupled to said system memory, wherein said processor comprises:

an adder configured to perform addition of respective mantissas of two floating-point operands to produce a sum, wherein a smaller-exponent one of said floating-point operands has a respective exponent less than or equal to a respective exponent of a larger-exponent one of said floating-point operands;

an alignment shifter coupled to provide an input to said adder and configured, in a first mode of operation that is active during execution of a floating-point addition instruction, to align said floating-point operands prior to said addition by shifting the respective mantissa of said smaller-exponent operand towards a least-significant bit position; and a rounding circuit configured to round said sum and a normalization circuit configured to normalize said sum, wherein said rounding circuit and said normalization circuit are configured such that during execution of any floating-point addition instruction, either said normalization circuit is operable to perform a normalization shift of said sum by more than one bit position, or said rounding circuit is operable to round said sum, but not both;

wherein said adder, said alignment shifter, said rounding circuit, and said normalization circuit are included within a floating-point adder pipeline comprising a plurality of pipeline stages, wherein the floating-point adder pipeline is configured to concurrently process multiple floating-point addition instructions that concurrently occupy different pipeline stages;

wherein said adder is operable, during execution of an instruction to convert an integer operand to floating-point format, to produce a result of conversion of said integer operand as said sum, wherein for at least some values of said integer operand, conversion of said integer operand to floating-point format requires both a normalization shift by more than one bit position and rounding, and wherein said rounding circuit is configured to round said result of conversion of said integer operand;

wherein said alignment shifter is further configured, in a second mode of operation that is active during execution of said instruction to convert said integer operand to floating-point format, to perform said normalization shift required by said conversion prior to said adder producing said result of conversion of said integer operand as said sum, such that execution of said instruction to convert said integer operand to floating-point format does not require additional execution latency relative to execution of said floating-point addition instruction.

16. The system as recited in claim 15, wherein said processor further comprises exponent difference logic configured to determine a difference of said respective exponents of said floating-point operands and to determine said smaller-exponent operand of said floating-point operands, wherein said alignment shifter is further configured to align said floating-point operands dependent upon said difference.

17. The system as recited in claim 15, wherein said processor further comprises leading-zero-detect logic configured to determine a count of leading zeros of said integer operand, wherein said alignment shifter is further configured to perform said normalization shift required by said conversion dependent upon said count.

18. The system as recited in claim 15, wherein said alignment shifter is configured as a rotator, and wherein to perform said normalization shift required by said conversion, said alignment shifter is further configured to rotate said integer operand towards said least significant bit position.

19. The system as recited in claim 15, wherein said rounding circuit is further configured to round said sum by providing a rounding constant to said adder to be added along with said respective mantissas.

20. The system as recited in claim 15, wherein said rounding circuit and said normalization circuit are coupled in parallel to an output of said adder.

21. The system as recited in claim 15, wherein said processor further comprises instruction fetch logic configured to issue said instruction to convert said integer operand to floating-point format, wherein said instruction fetch logic is further configured to issue a first instruction from one of a plurality of threads during one execution cycle and to issue a second instruction from another one of said plurality of threads during a successive execution cycle.

* * * * *